United States Patent
Chan et al.

(10) Patent No.: US 9,954,543 B1
(45) Date of Patent: Apr. 24, 2018

(54) FAST COARSE TUNE AND FINE TUNE CALIBRATION FOR A SYNTHESIZER BY MULTI-CURVE CALIBRATION WITHIN A TARGET WINDOW

(71) Applicant: Hong Kong Applied Science and Technology Research Institute Company, Limited, Hong Kong (HK)

(72) Inventors: Tat Fu Chan, Hong Kong (HK); Shiyuan Zheng, Hong Kong (HK); Yunlong Li, Hong Kong (HK); Wang Chi Cheng, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 15/427,292

(22) Filed: Feb. 8, 2017

(51) Int. Cl.
*H03B 21/00* (2006.01)
*H03L 7/197* (2006.01)
*H03L 7/099* (2006.01)
*H03L 7/089* (2006.01)
*H03L 7/093* (2006.01)

(52) U.S. Cl.
CPC .......... *H03L 7/1974* (2013.01); *H03L 7/0891* (2013.01); *H03L 7/093* (2013.01); *H03L 7/099* (2013.01)

(58) Field of Classification Search
None
See application file for complete search history.

(56) References Cited

U.S. PATENT DOCUMENTS

| | | | |
|---|---|---|---|
| 7,019,595 B1 | 3/2006 | Lo et al. | |
| 7,907,021 B2 | 3/2011 | Chen | |
| 9,455,854 B2 | 9/2016 | Gao et al. | |
| 2003/0171106 A1* | 9/2003 | Dunworth | H03L 5/00 455/262 |

(Continued)

FOREIGN PATENT DOCUMENTS

| | | |
|---|---|---|
| CN | 101090263 A | 12/2007 |
| CN | 101272143 A | 9/2008 |
| CN | 102699769 A | 4/2010 |

OTHER PUBLICATIONS

ISR and Written Opinion, PCT/CN2017/073390, dated Nov. 15, 2017.

*Primary Examiner* — Cassandra Cox
(74) *Attorney, Agent, or Firm* — Stuart T. Auvinen; gPatent LLC

(57) ABSTRACT

A Phase-Locked Loop (PLL) has a multi-curve voltage-controlled oscillator (VCO) with a curve-select input that adjusts the capacitance within the VCO and thus the VCO gain. A calibration unit generates a curve-select value to the VCO. Coarse calibration selects a Center Curve CC value using binary search of the curve-select bits. During fine calibration, the number of pulses of the VCO output are counted and stored for all curves in a target window around the center curve. The stored pulse counts are compared to an ideal pulse count for a specified frequency, and the curve-select value for the closest-matching pulse count is applied to the VCO. The target window is much smaller than all possible curves, so calibration is performed only on a few curves, reducing calibration time. A switch before the VCO opens the loop for faster open-loop calibration. Pulses are counted digitally without expensive analog comparators.

20 Claims, 10 Drawing Sheets

(56) References Cited

U.S. PATENT DOCUMENTS

| | | | |
|---|---|---|---|
| 2005/0258906 A1* | 11/2005 | Su | H03L 7/099 331/10 |
| 2006/0145776 A1 | 7/2006 | Shi et al. | |
| 2006/0238261 A1 | 10/2006 | Rhee et al. | |
| 2013/0082754 A1 | 4/2013 | Chern et al. | |
| 2014/0320184 A1 | 10/2014 | Chen et al. | |
| 2016/0197601 A1 | 7/2016 | Han et al. | |
| 2016/0308542 A1 | 10/2016 | Liu et al. | |

* cited by examiner

FAST COARSE TUNE AND FINE TUNE CALIBRATION FOR A SYNTHESIZER BY MULTI-CURVE CALIBRATION WITHIN A TARGET WINDOW

FIELD OF THE INVENTION

This invention relates to Phase-Locked Loops (PLL's), and more particularly to calibration of a multi-curve Voltage-Controlled Oscillator (VCO) in a PLL clock synthesizer.

BACKGROUND OF THE INVENTION

Wireless communication systems often require precise clocks that may be modulated to carry data. A clock may be generated using a Phase-Locked Loop (PLL) that has a voltage-controlled oscillator (VCO) that converts an input voltage to an output clock with a frequency that depends on the input voltage.

Some communication standards employ many frequencies and may hop from one frequency channel to another to avoid interference or other impediments to transmission. The VCO may thus be required to operate over a wide range of frequencies, and require a large gain. Large VCO gains often require a large chip area and thus a higher cost of manufacture and power.

FIG. 1A is a graph of operation of a multi-curve VCO. One solution to provide a wide frequency range with a low-gain VCO is to use a multi-curve VCO. The VCO can operate using one of many operating curves 20. As the internal capacitance C within the VCO is increased, a lower one of operating curves 20 is selected as selected curve 22. Selected curve 22 has a center frequency FC when a center voltage VC is applied as the input voltage to the VCO. As capacitance C is increased, a lower one of operating curves 20 is selected having a lower center frequency FC.

Since there are many operating curves 20, a wider range of frequencies is available than if only one curve 22 were available. The slope of each of operating curves 20 can be more flat than if a single operating curve had to cover all frequencies. The lower slope is a visual representation of lower VCO gain.

FIG. 1B shows a multi-curve Inductor-Capacitor VCO. An LC oscillator has varactors to continuously control the oscillator frequency of the VCO for curve 20. Inductors 90, 92 and variable capacitors 94, 96 can be binary-weighted or thermometer coded and load cross-coupled n-channel transistors 76, 78, which have their source currents sunk by current sink 74.

Capacitor arrays 70, 72 add capacitance loading to the LC oscillator to generate a multi-curve VCO output. Capacitor arrays 70, 72 can be binary-weighted capacitor arrays with a binary input that selects the capacitance value of the variable capacitor.

FIG. 1C shows a multi-curve ring-oscillator VCO. Inverters 12, 14, 16 are connected in a ring causing OUT to oscillate high and low. Variable capacitor 10 slows the output of inverter 12, increasing the loop delay and reducing the frequency of OUT. Variable capacitor 10 may be a binary-weighted capacitor array with a binary input that selects the capacitance value of variable capacitor 10. Other variable capacitors 10 may be added to the outputs of inverters 14, 16 to slow their outputs.

FIG. 1D shows a multi-curve VCO with a binary-weighted source current. Inverters 17, 18, 19 are connected in a ring causing OUT to oscillate high and low. Variable discrete current is provided by selecting some of binary-weighted current-supply p-channel transistors 82 using switches 84 that drive current to the power supplies of inverters 17, 18, 19. The gate bias to transistors 82 is provided by bias p-channel transistor 62 in series with current sink 60. Variable current source 68 may also adjust current through p-channel transistors 66, 64.

Increasing the discrete current from transistors 82 results in deceasing the output resistance of inverters 17, 18, 19 and increasing the frequency OUT. The variable discrete current source may be binary-weighted with a binary input that selects the current source value using switches 84.

When a multi-curve VCO is employed, some mechanism is needed to select which of operating curves 20 is selected as selected curve 22. When the frequency being used is changed, selected curve 22 also changes to another one of operating curves 20. Since the frequencies used by operating curves 20 are often close to one another, very little separation is available between operating curves 20, and Process, power-supply Voltage, and Temperature (PVT) variations can be much larger than the frequency separations. The center frequency FC of a curve can vary significantly with PVT. Thus the center frequencies FC of all curves may be calibrated first before normal operation. However, there may be many operating curves 20, such as $2^6$ or 64, and calibration of all these curves may require too much time and result in start-up delays that are undesirable.

As the system warms up, PVT may continue to vary, forcing re-calibration and more delays. Operation near the target frequency of the wireless channel may not be possible when the center frequency FC shifts with PVT since operating curves 20 have a shallow slope.

Some systems are closed loop, where the PLL loop filter remains connected to the VCO input during calibration. This is undesirable due to the extra settling time for the loop. Open loop systems disconnect the PLL loop filter from the VCO input during calibration, resulting in faster calibration times.

What is desired is a multi-curve VCO PLL with an open-loop calibration system. A calibration system that does not calibrate all operating curves is desirable to reduce calibration time. A very precise calibration system is desired yet one that can quickly select a group of operating curves for more precise calibration, without requiring calibration of all operating curves. A calibration unit that does not require precision analog comparators is desirable. A low-power and low area calibration unit is desired.

DETAILED DESCRIPTION

The present invention relates to an improvement in multi-curve VCO calibration for PLL's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
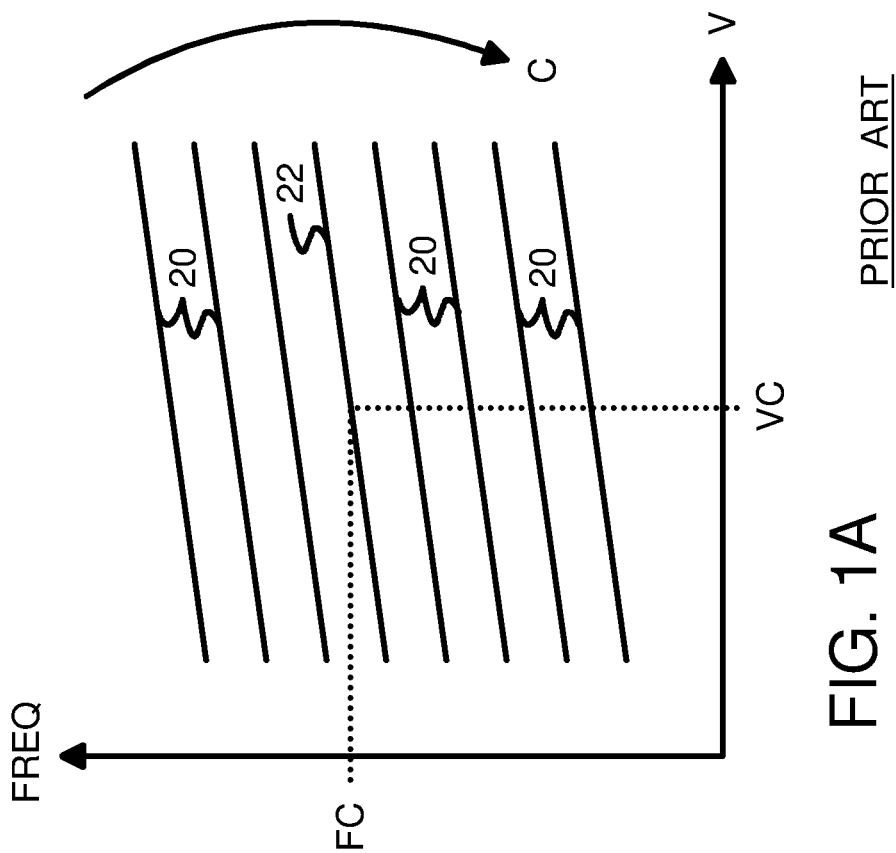
FIG. 1A is a graph of operation of a multi-curve VCO.
Figure 1B:
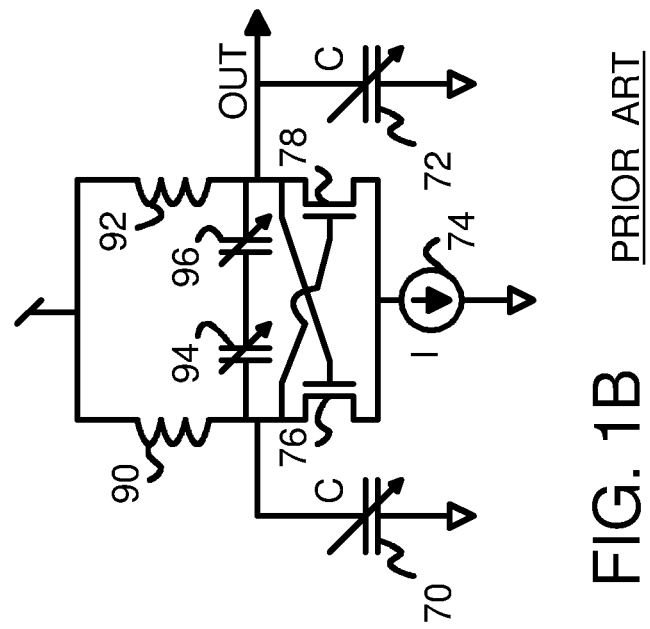
FIGS. 1B-D show various kinds of multi-curve VCOs.
Figure 1D:
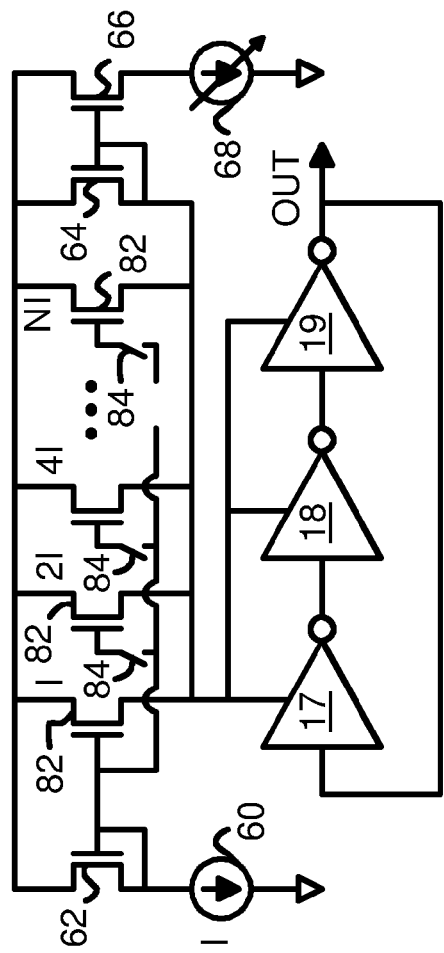
Figure 1C:
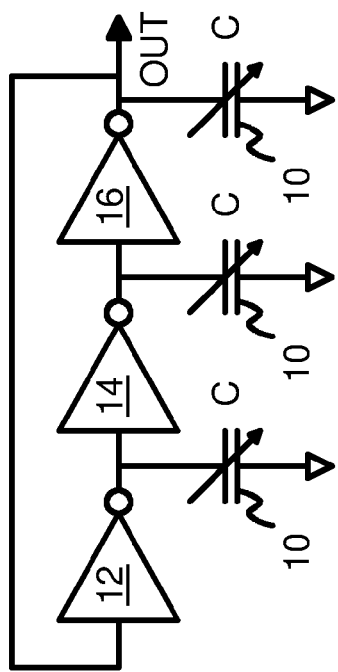
Figure 2:
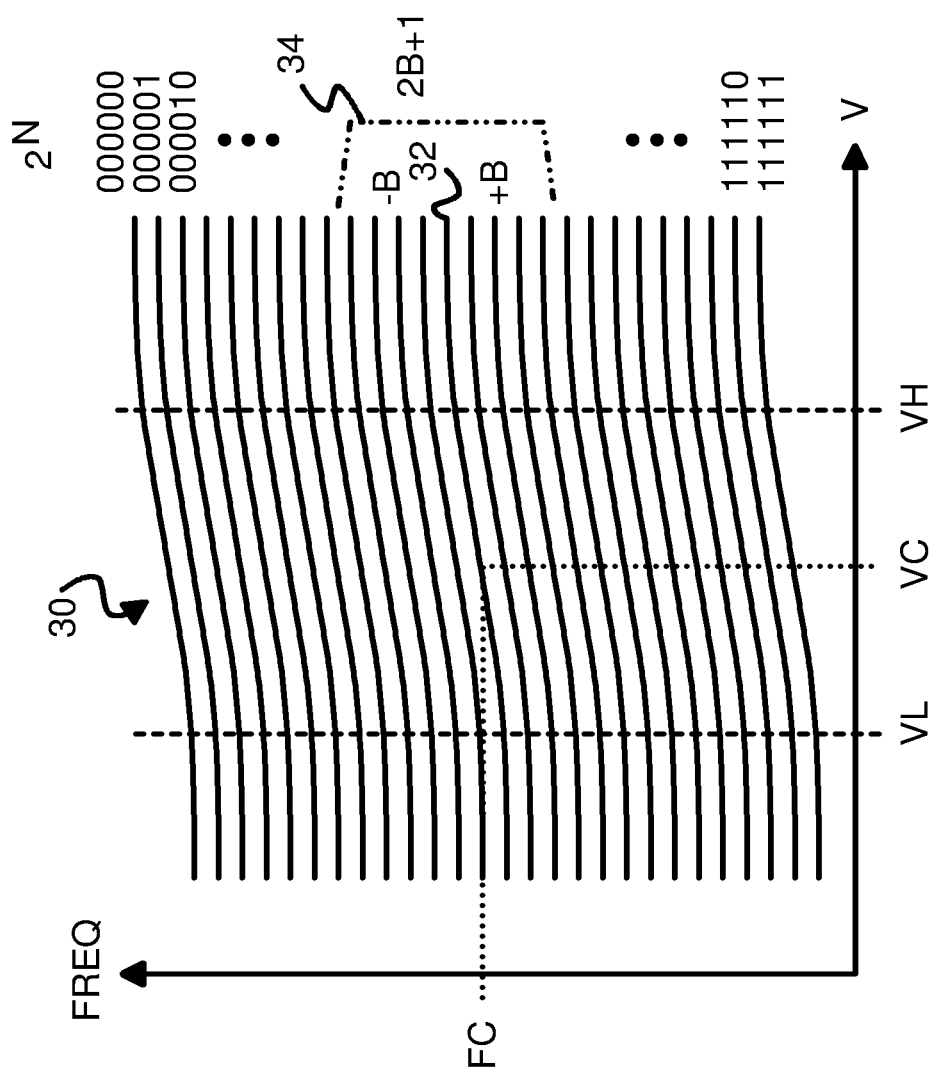
FIG. 2 is a graph highlighting coarse selection of a window of operating curves for a multi-curve VCO.

FIG. 2 is a graph highlighting coarse selection of a window of operating curves for a multi-curve VCO. Rather than calibrate all operating curves, the inventors calibrate only a subset of the operating curves. The frequency channel selected by the transceiver has a specified frequency that most closely matches the center frequency FCS of coarsely-selected curve 32. However, since selection is coarse, it is possible that the wrong one of operating curves 30 was selected. One of the curves adjacent to coarsely-selected curve 32 may be the best-match to the specified frequency when a more precise calibration is performed.

Operating curves 30 that are close to coarsely-selected curve 32 are selected for further calibration. These nearby curves form target window 34, which includes coarsely-selected curve 32, and B nearby curves above and below coarsely-selected curve 32, for a total of 2B+1 curves. B can be any whole number from 1 to (2N-1)/2 for less accurate coarse selection of coarsely-selected curve 32.

In this simple example, there are $2^6$ operating curves 30, identified by curve-select values from 000000 for the highest-frequency curve, to 111111 for the lowest-frequency curve in operating curves 30. Thus there are a total of 64 operating curves 30. When B is 4, there are 9 curves in target window 34, so only 9 of 64 or 14% of operating curves 30 need to be precisely calibrated. The other 55 curves outside of target window 34 are not calibrated. Calibration time is significantly reduced since only 14% of operating curves 30 are finely calibrated.

Figure 3:
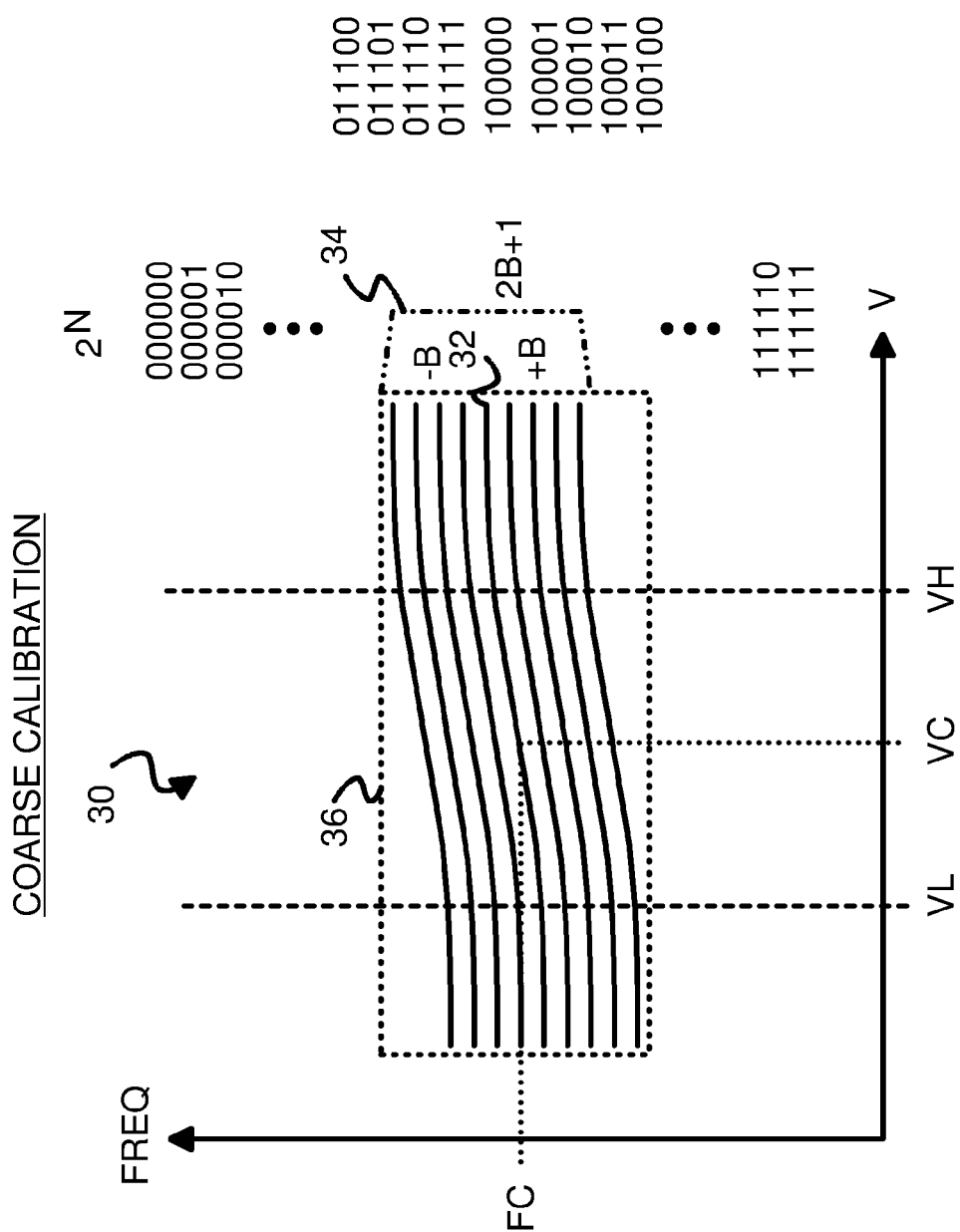
FIG. 3 highlights the results of coarse calibration.

FIG. 3 highlights the results of coarse calibration. Coarse calibration selects coarsely-selected curve 32 and then adds B of operating curves 30 on each side of coarsely-selected curve 32 to form target window 34.

Fine calibration very accurately measures the center frequency FC of each of the 2B+1 curves in target window 34. During normal operation, the VCO input voltage may vary between VL and VH around center voltage VC, causing the output frequency from the VCO to vary. Bounding box 36 is drawn around all of the 2B+1 curves in target window 34. While PVT variations and inaccuracies in coarse calibration may cause coarsely-selected curve 32 not to be the selected curve by fine calibration, if B is large enough the fine-calibration-selected curve will be from among the 2B+1 curves of target window 34, and within bounding box 36.

The curve-select values for curves in target window 34 range from 011100 to 100100 with coarsely-selected curve 32 having a value of 1000000. Operating curves 30 from 000000 to 011011 and from 100101 to 111111 are not considered for fine calibration, saving calibration time. Thus the majority of operating curves 30 are not finely calibrated once coarse calibration determines that they are outside of target window 34.

Figure 4:
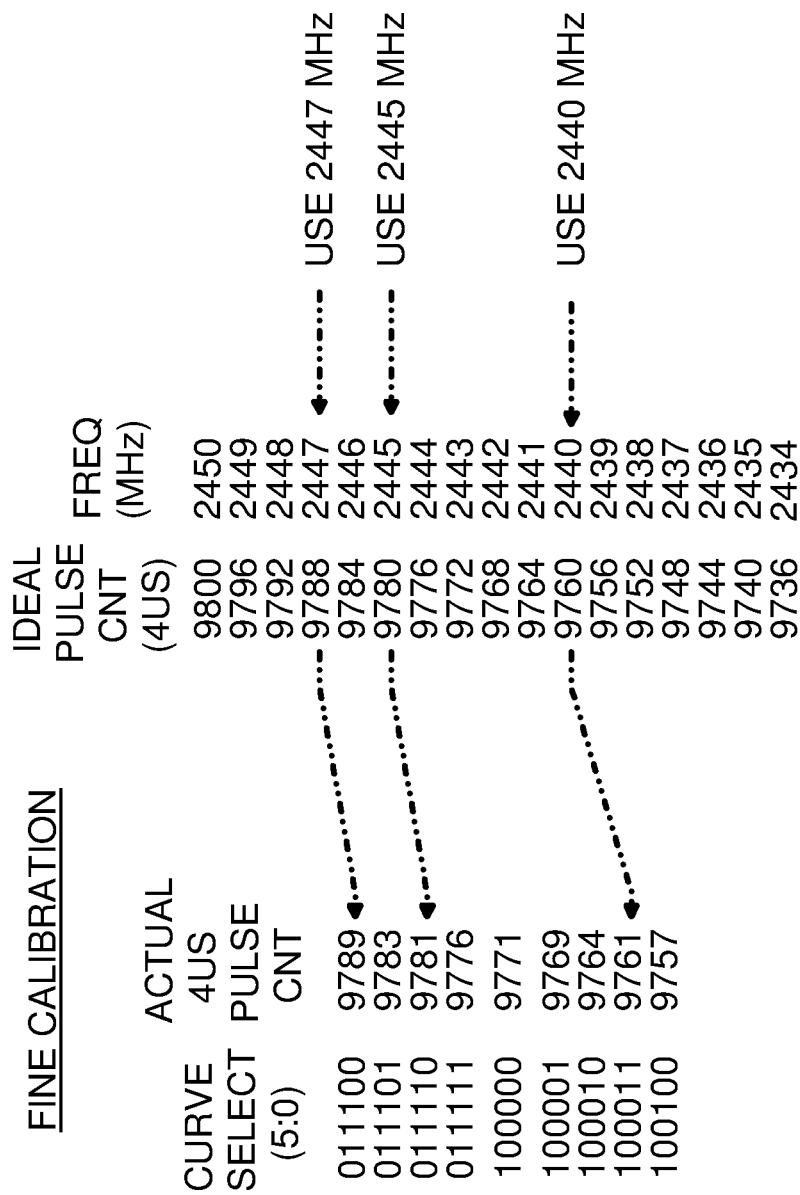
FIG. 4 highlights fine calibration.

FIG. 4 highlights fine calibration. During fine calibration, the curve-select value CS(5:0) is applied to the VCO to set its internal capacitance and delay, and the VCO's output frequency is carefully measured. The output frequency is measured by counting pulses of the VCO output over a long period of time, such as 4 micro-seconds (µs).

Each of the 2B+1 curves in target window 34 has its curve-select value applied to the VCO and its output pulses counted for 4 µs. The count for each curve is stored in a register. For example, coarsely-selected curve 32 in the middle of target window 34 has a curve-select value of 100000 and 9771 pulses were measured during its 4 µs fine-calibration period. The next curve in target window 34 has a curve-select value of 100001 and had 9769 pulses measured. Then the next curve has a curve-select value of 100010 and had 9764 pulses measured.

The number of pulses measured varied from 9757 for curve-select 100100 at the bottom of target window 34, to 9789 for curve-select 011100 at the top of target window 34. Note that the pulse counts are not exactly evenly spaced. Some adjacent curves have counts that differ by 3, while others have counts that differ by 4 or even 5. Some spacing are as little as 2. This variation is due to non-linearities in operating curves 30. Inaccuracies in measurement or jitter from the VCO may also be present.

In FIG. 4, the measured pulse counts are stored for each of the 2B+1 curve-select values for curves within target window 34. The specified frequency from the transceiver is then converted to an ideal pulse count for a 4 µs period. For example, when the transceiver specifies that 2440 MHz is to be used, the ideal pulse count for 2440 MHz is 9760. This ideal pulse count is compared to the stored measured pulse counts for curves in target window 34. The closest matching count is 9761, which is a difference of 1, while the next-closest measured counts of 9764 and 9757 have larger differences from the ideal count of 9760, of 4 and 3, respectively. Thus the curve-select value of 100011 is chosen since its measured pulse count of 9761 is closest to the ideal count of 9760.

The transceiver may jump or hop to a different frequency, such as to avoid interference. Sometimes the hop is to a nearby frequency that is still within target window 34. For example, the transceiver may jump from 2440 MHz to 2445 MHz. The new frequency of 2445 MHz has an ideal pulse count of 9780 pulse, which is closest to 9781 for curve-select 011110. The new curve-select is applied to the VCO to cause the frequency to hop from 2440 MHz to 2445 MHz. Re-calibration is not needed since the new frequency is still within target window 34.

The frequency specified could hop to 2447 MHz and still be within target window 34. Coarsely-selected curve 32 could have been 100000 for 2445 MHz, but once fine calibration is performed, the best-match for 2445 MHz was curve 011110, which is 2 curves away from the middle curve first selected by coarse calibration.

Figure 5:
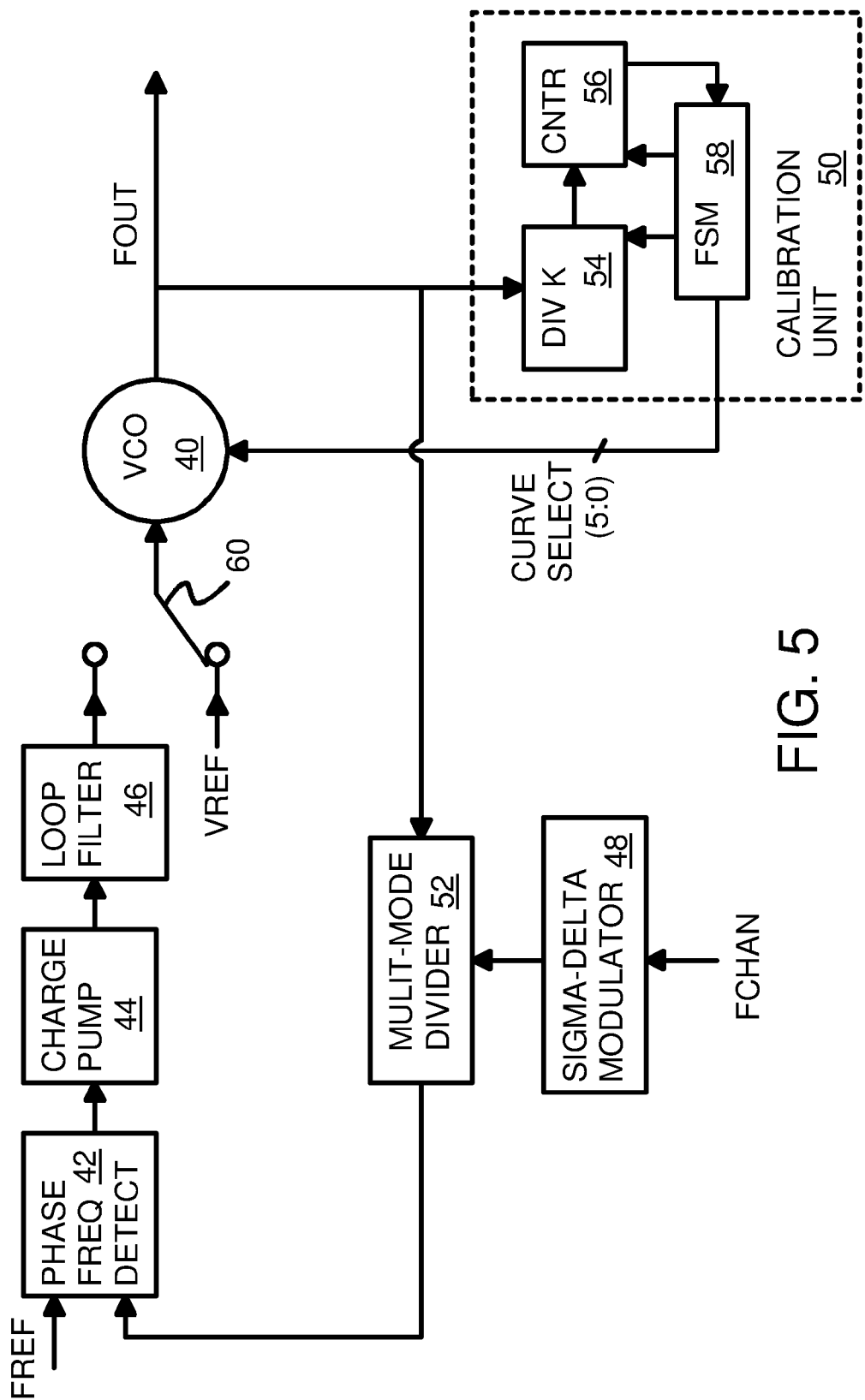
FIG. 5 is a block diagram of a clock synthesizer with coarse and fine calibration of a multi-curve VCO.

FIG. 5 is a block diagram of a clock synthesizer with coarse and fine calibration of a multi-curve VCO. A Phase-Locked Loop (PLL) is formed by phase-frequency detector 42, charge pump 44, loop filter 46, switch 60, VCO 40, and multi-mode divider 52. The output clock FOUT from VCO 40 is divided by multi-mode divider 52 and compared to a reference clock FREF by phase-frequency detector 42. The comparison result causes charge pump 44 to charge or discharge loop filter 46, which adjusts the input voltage to VCO 40. VCO 40 responds to changes in its input voltage by adjusting the frequency of output clock FOUT.

The specified center frequency FCS is determined by a wireless standard such as Bluetooth from 2400 MHz to 2480 MHz which has a center frequency FCS of 2440 MHz. Sigma-delta modulator 48 generates signals that dither the divisor used by multi-mode divider 52 so that fractional divisor values may be achieved although multi-mode divider 52 is using integer divisors. Integer divisors such as N and N+1 can be averaged over several cycles to achieve a desired fractional divisor, and allow a more arbitrary value of FOUT to be generate from FREF. The PLL loop smoothes out the resulting variations as two integer divisor values are alternated by sigma-delta modulator 48 and multi-mode divider 52.

When a new frequency is specified, FCHAN changes and may cause multi-mode divider 52 to change its divisors, and Sigma-delta modulator 48 to change its dithering periods. FOUT=FREF×N, where N is the multi-mode divisor ratio, which can have an integer part n and a fraction part f (so N=n.f). For example, when FREF is 32 MHz and the desired FOUT is 2440 MHz, then 2440 M=32M×N, or N=76.25. The integer part n can be input to multi-mode divider 52 while the fractional part f is applied to sigma-delta modulator 48. The fractional part f is FCHAN divided by $2^B$, where B is the bit width of sigma-delta modulator 48, such as 17. So the fractional part can be .25 when FCHAN is 32768.

In another example, the output frequency FOUT is change to 2444 MHz if FCHAN is adjusted to 49152, when FREF is 32 MHz.

During calibration, switch 60 connects the voltage input to VCO 40 to reference voltage VREF. The connection from loop filter 46 is broken by switch 60 during calibration mode. Thus calibration is performed in an open-loop configuration. The open-loop configuration is desirable since calibration settling time does not depend on long delays through the entire PLL loop.

Calibration unit 50 measures the frequency of FOUT by counting pulses. Divider 54 divides FOUT by K, where K is a real number of at least 1. The divided-by-K output of divider 54 is slower than FOUT, allowing counter 56 to operate more slowly and with less power. An all-digital counter has a lower area, power consumption, and cost than an analog comparator, and is less susceptible to process variations.

Finite State Machine (FSM) 58 controls the sequence of operations during calibration mode. During coarse calibration, FSM 58 performs a binary search routine to adjust the curve-select value and test successive bits, starting with the MSB and finishing with the LSB of the curve-select value. As each successive curve-select value is tested, the pulse count from counter 56 is read by FSM 58 and used to decide if the binary bit of the curve-select value that is being tested should be 1 or 0. For example, when the VCO is too fast, and the measured frequency is too high, the pulse count will be above the ideal pulse count for the specified center frequency FCS. FSM 58 will force to 1 the current bit in the curve-select value to cause a slower frequency curve to be selected. Then the next lower significant bit in the curve-select value can be tested in a similar manner. Once all bits in the curve-select value have been tested in this manner, the final value of the curve select is the identifier for coarsely-selected curve 32 (FIG. 3).

During fine calibration, FSM 58 reads the count value from counter 56 after a 4 µs period has elapsed, and stores this value along with the curve-select value CS(5:0) that was applied to VCO 40 during the 4 µs period. FSM 58 then increments, decrements, or otherwise changes the curve-select value applied to VCO 40 and another 4 µs period of pulses is counted by counter 56 and stored for that value of the curve select. All operating curves within target window 34 are fine calibrated by counting pulses in a similar manner.

FSM 58 can compare the ideal count value for the specified frequency to the count values stored during fine calibration. The curve-select for the closest match is applied to VCO 40 and switch 60 is closed to connect loop filter 46 to VCO 40, allowing normal closed-loop PLL operation to occur.

Figure 6:
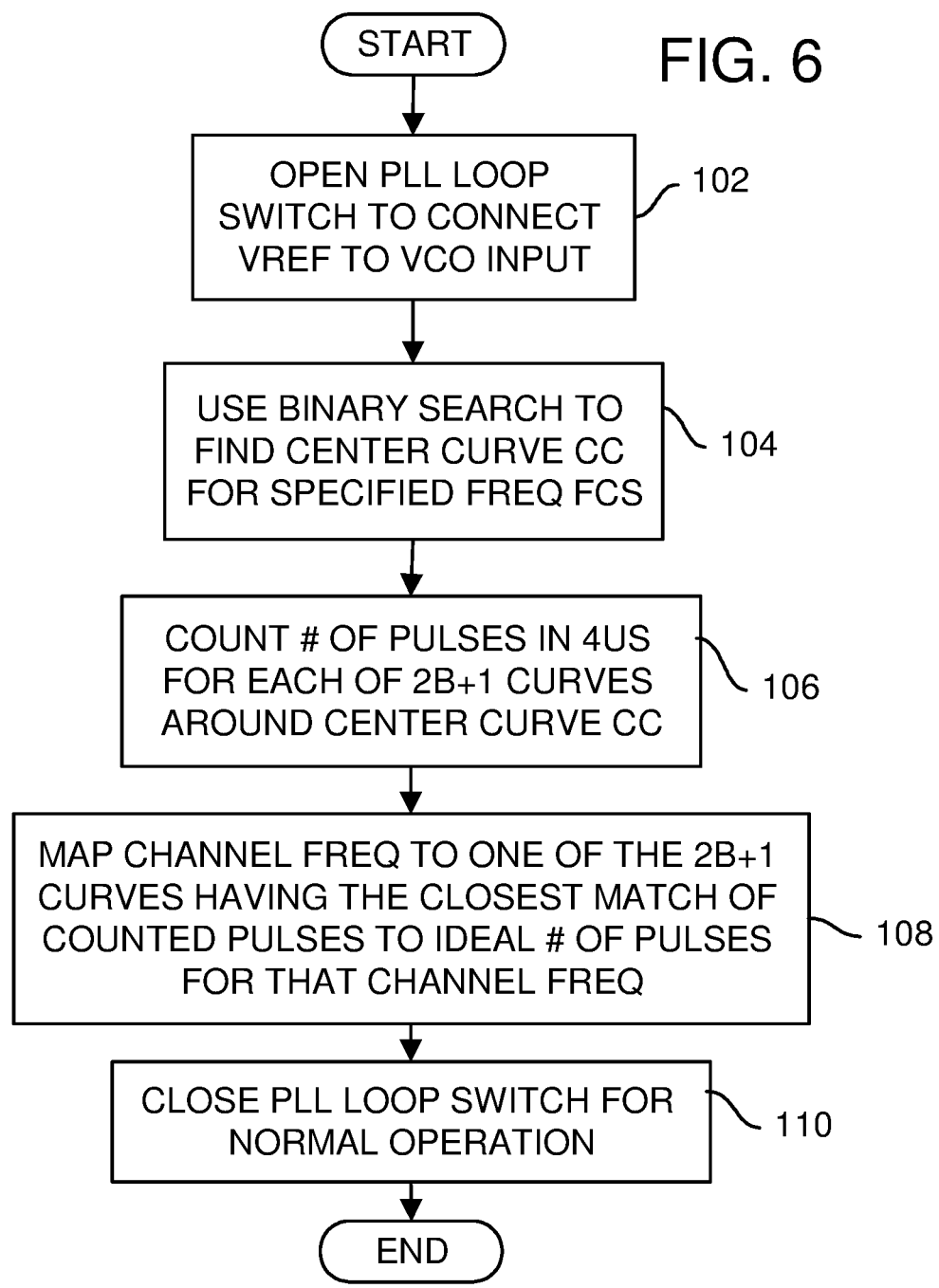
FIG. 6 is a flowchart of coarse and fine calibration of the multi-curve PLL of Fig.

FIG. 6 is a flowchart of coarse and fine calibration of the multi-curve PLL of FIG. 5. Switch 60 is opened to connect reference voltage VREF to VCO 40, opening the PLL loop, step 102. Coarse calibration, step 104, is performed by using a binary search method to find the curve-select value CS(5:0) for coarsely-selected curve 32, which is the center curve CC for the center frequency FC that is closest to the specified frequency FCS of the transceiver. The number of pulses for coarsely-selected curve 32 may be counted at the end of coarse calibration, step 104, or as part of fine calibration, step 106.

Fine calibration, step 106, receives the curve-select value for coarsely-selected curve 32 from coarse calibration step 104. This curve-select value is incremented B times, reset, and then decremented B times to generate curve-select values for each of the 2B+1 curves in target window 34. The number of pulses in a 4 µs period is counted and stored for each of these 2B+1 curves (or 2B curves if coarsely-selected curve 32 is measured earlier during step 104).

The specified channel frequency is converted to a number of pulses for a 4 µs period, and this ideal pulse count compared to the stored pulse counts for the 2B+1 curves, step 108. The curve-select value having the closest match of its counted pulses to the ideal pulse count is selected and applied to VCO 40. Switch 60 disconnects VREF and applies the voltage from loop filter 46 to the input of VCO 40, step 110. Normal closed-loop operation can begin, using the curve selected by coarse and fine calibration.

Figure 7:
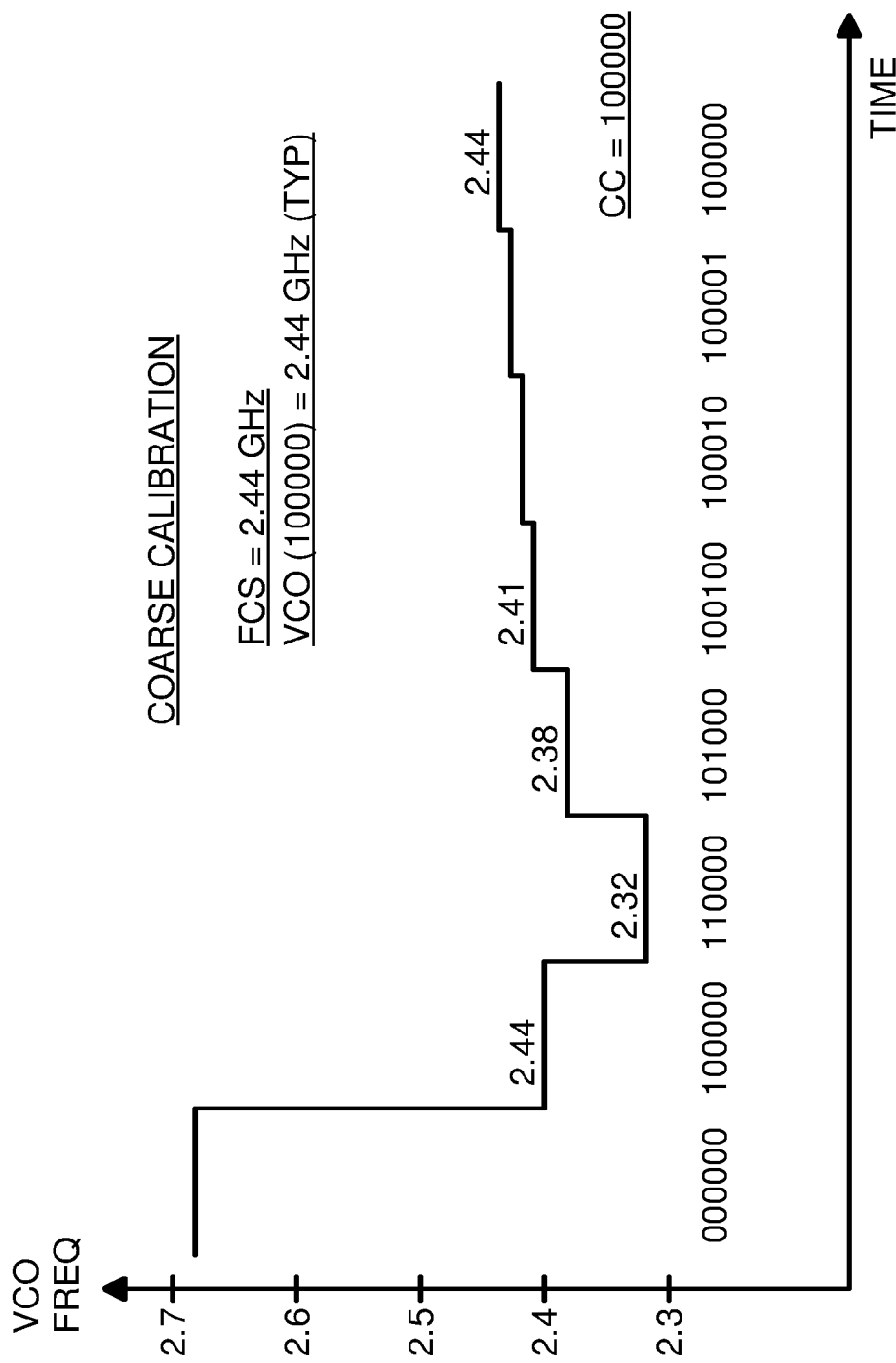
FIG. 7 is a graph highlighting binary search during coarse calibration.

FIG. 7 is a graph highlighting binary search during coarse calibration. In this example, the specified frequency FCS is 2.44 GHz and the VCO has typical process, voltage, and temperature conditions. Under these typical conditions, the VCO outputs a FOUT clock with a frequency of 2.44 GHz for the middle curve that has a curve-select value of 100000.

As coarse calibration begins, the FSM applies a value of 100000 to the curve-select input of VCO 40 to test the MSB=1. The pulses of FOUT are counted for 4 µs and a count value that corresponds to the ideal count value for 2.44 GHz is read from counter 56 by FSM 58. Since the measured count value is equal to the ideal count value, the MSB is set to 1 and remains high as other bits are tested.

The $2^{nd}$ MSB is tested next. The FSM sets it to 1 and the lower bits to 0, testing a value of 110000 for the curve-select applied to VCO 40. The resulting frequency from the VCO is 2.32 GHz, which has a count value that is less than the ideal count value for the specified frequency of 2.44 GHz. Since the measured count value (for 2.32 GHz) is less than the ideal count value (for 2.44 GHz), the tested $2^{nd}$ MSB bit is set to 0 and remains low as other bits are tested.

The $3^{rd}$ MSB is tested next. The FSM sets it to 1 and the lower bits to 0, testing a value of 101000 for the curve-select applied to VCO 40. The resulting frequency from the VCO is 2.38 GHz, which has a count value that is less than the ideal count value for the specified frequency of 2.44 GHz. Since the measured count value (for 2.38 GHz) is less than the ideal count value (for 2.44 GHz), the tested 3rd MSB bit is set to 0 and remains low as other bits are tested.

The 4th MSB CS(2) is tested next. The FSM sets it to 1 and the lower bits to 0, testing a value of 100100 for the curve-select applied to VCO 40. The resulting frequency from the VCO is 2.41 GHz, which has a count value that is less than the ideal count value for the specified frequency of 2.44 GHz. Since the measured count value (for 2.41 GHz)

is less than the ideal count value (for 2.44 GHz), the tested CS(2) bit is set to 0 and remains low as other bits are tested.

The process is repeated for bits CS(1) and CS(0), which both have frequencies that are lower than FCS, causing them to be set to 0. The final value of curve select CS(5:0) is 100000. This value of CS(5:0) is the Center Curve CC, coarsely-selected curve 32 (FIG. 3). This final value is applied to VCO 40 last to allow its count value to be measured and stored. Thus the fine calibration for coarsely-selected curve 32 can be performed at the end of coarse calibration. The measured count corresponds to the specified frequency's ideal count for 2.44 GHz.

Figure 8:
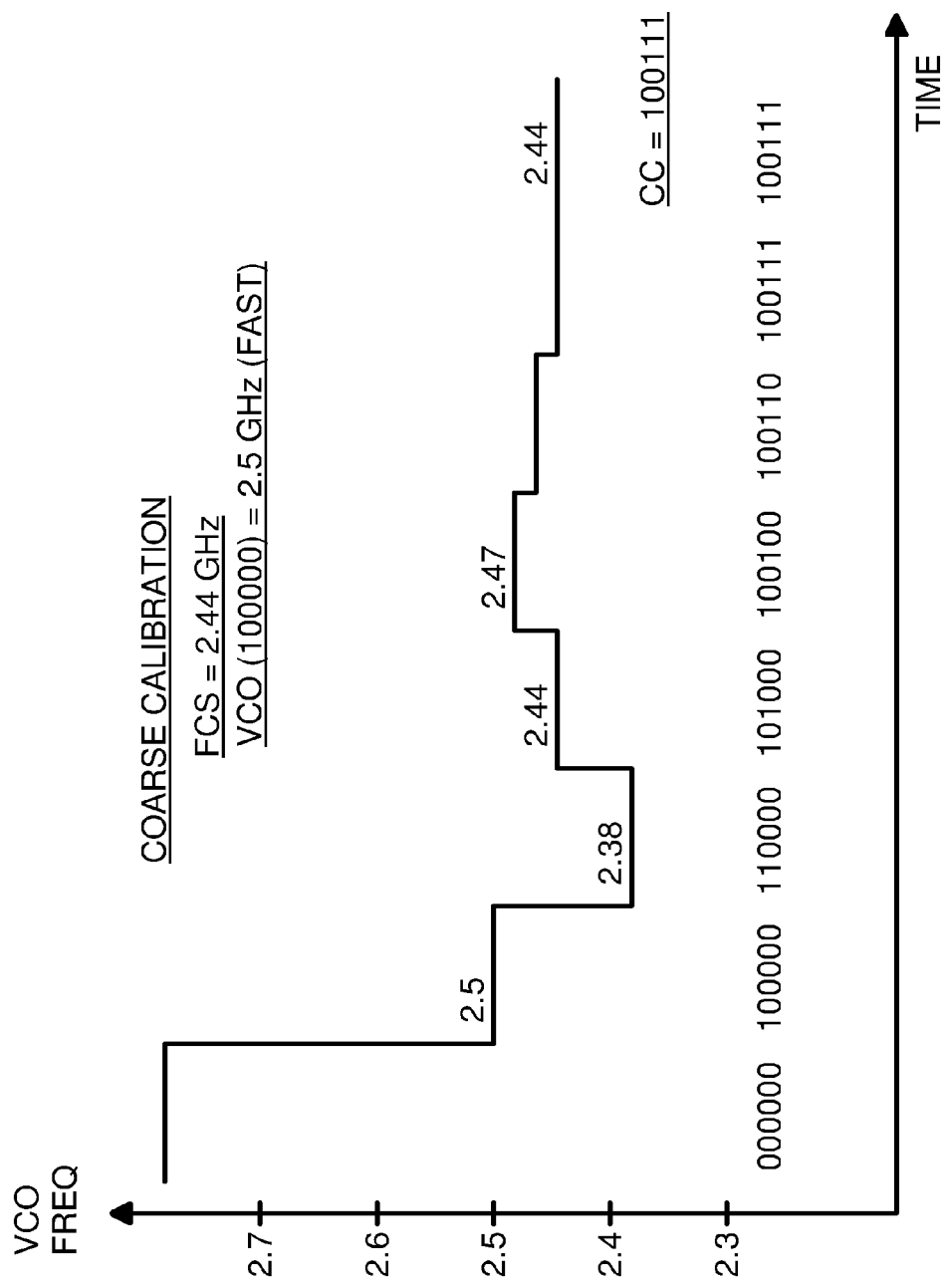
FIG. 8 is a graph highlighting binary search during coarse calibration of a fast P, V, T corner.

FIG. 8 is a graph highlighting binary search during coarse calibration of a fast P,V,T corner. In this example, the specified frequency FCS is 2.44 GHz but the VCO has fast process, voltage, and temperature conditions. Under these fast conditions, the VCO outputs a FOUT clock with a faster frequency of 2.5 GHz for the middle curve that has a curve-select value of 100000.

As coarse calibration begins, the FSM applies a value of 100000 to the curve-select input of VCO 40 to test the MSB=1. The pulses of FOUT are counted for 4 μs and a count value that is greater than that corresponding to the ideal count value for 2.44 GHz is read from counter 56 by FSM 58. Since the measured count value (for 2.50 GHz) is larger than the ideal count value (for 2.44 GHz), the MSB CS(5) is set to 1 and remains high as other bits are tested.

The $2^{nd}$ MSB CS(4) is tested next. The FSM sets it to 1 and the lower bits to 0, testing a value of 110000 for the curve-select applied to VCO 40. The resulting frequency from the VCO is 2.38 GHz, which has a count value that is less than the ideal count value for the specified frequency of 2.44 GHz. Since the measured count value (for 2.38 GHz) is less than the ideal count value (for 2.44 GHz), the tested $2^{nd}$ MSB bit is set to 0 and remains low as other bits are tested.

The $3^{rd}$ MSB CS(3) is tested next. The FSM sets it to 1 and the lower bits to 0, testing a value of 101000 for the curve-select applied to VCO 40. The resulting frequency from the VCO is 2.44 GHz, which has a count value that is less than or equal to the ideal count value for the specified frequency of 2.44 GHz. Since the measured count value (for 2.44 GHz) is equal to the ideal count value (for 2.44 GHz), the tested 3rd MSB bit is set to 0 and remains low as other bits are tested.

The 4th MSB CS(2) is tested next. The FSM sets it to 1 and the lower bits to 0, testing a value of 100100 for the curve-select applied to VCO 40. The resulting frequency from the VCO is 2.47 GHz, which has a count value that is more than the ideal count value for the specified frequency of 2.44 GHz. Since the measured count value (for 2.47 GHz) is greater than the ideal count value (for 2.44 GHz), the tested CS(2) bit is set to 1 and remains high as other bits are tested.

The process is repeated for bits CS(1) and CS(0), which both have frequencies that are higher than FCS, causing them to be set to 1. The final value of curve select CS(5:0) is 100111. This final value (CC) of coarsely-selected curve 32 is applied to VCO 40 last to allow its count value to be measured and stored.

Since 100111 selects an operating curve that is lower than middle curve 100000 (FIG. 2), the fast VCO is compensated for by choosing a curve with a slower frequency. The specified frequency of 2.44 GHz is achieved using a slower operating curve.

Figure 9:
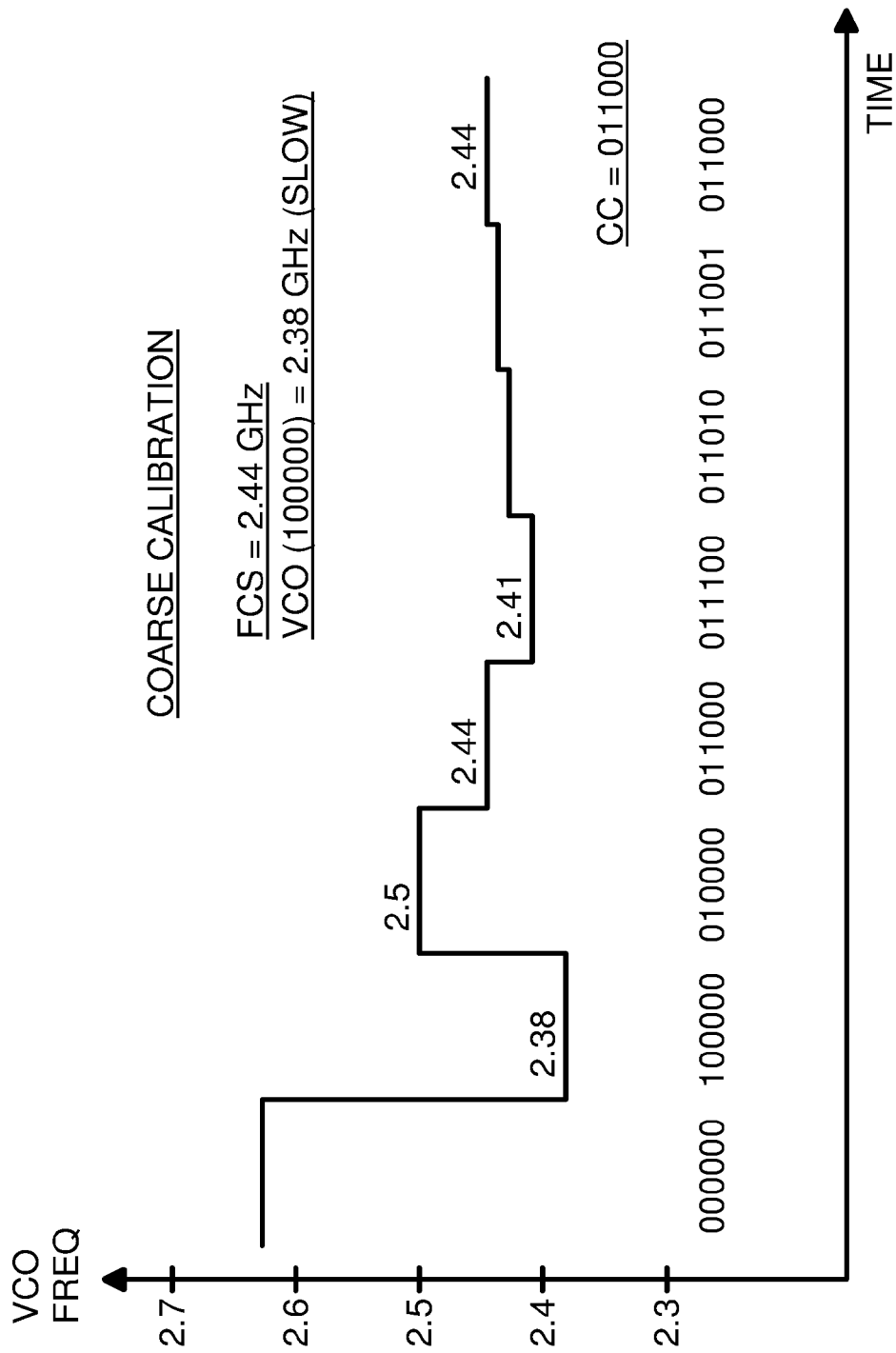
FIG. 9 is a graph highlighting binary search during coarse calibration of a slow process corner.

FIG. 9 is a graph highlighting binary search during coarse calibration of a slow process corner. In this example, the specified frequency FCS is 2.44 GHz but the VCO has slow process, voltage, and temperature conditions. Under these slow conditions, the VCO outputs a FOUT clock with a slower frequency of 2.38 GHz for the middle curve that has a curve-select value of 100000.

As coarse calibration begins, the FSM applies a value of 100000 to the curve-select input of VCO 40 to test the MSB=1. The pulses of FOUT are counted for 4 μs and a count value that is less than that corresponding to the ideal count value for 2.44 GHz is read from counter 56 by FSM 58. Since the measured count value (for 2.38 GHz) is less than the ideal count value (for 2.44 GHz), the MSB CS(5) is set to 0 and remains low as other bits are tested.

The $2^{nd}$ MSB CS(4) is tested next. The FSM sets it to 1 and the lower bits to 0, testing a value of 010000 for the curve-select applied to VCO 40. The resulting frequency from the VCO is 2.5 GHz, which has a count value that is greater than the ideal count value for the specified frequency of 2.44 GHz. Since the measured count value (for 2.5 GHz) is greater than the ideal count value (for 2.44 GHz), the tested $2^{nd}$ MSB bit is set to 1 and remains high as other bits are tested.

The $3^{rd}$ MSB CS(3) is tested next. The FSM sets it to 1 and the lower bits to 0, testing a value of 011000 for the curve-select applied to VCO 40. The resulting frequency from the VCO is 2.44 GHz, which has a count value that is greater than or equal to the ideal count value for the specified frequency of 2.44 GHz. Since the measured count value (for 2.44 GHz) is equal to the ideal count value (for 2.44 GHz), the tested 3rd MSB bit is set to 1 and remains high as other bits are tested.

The 4th MSB CS(2) is tested next. The FSM sets it to 1 and the lower bits to 0, testing a value of 011100 for the curve-select applied to VCO 40. The resulting frequency from the VCO is 2.41 GHz, which has a count value that is less than the ideal count value for the specified frequency of 2.44 GHz. Since the measured count value (for 2.41 GHz) is less than the ideal count value (for 2.44 GHz), the tested CS(2) bit is set to 0 and remains low as other bits are tested.

The process is repeated for bits CS(1) and CS(0), which both have frequencies that are less than FCS, causing them to be set to 0. The final value CC of curve select CS(5:0) is 011000. This final value is applied to VCO 40 last to allow its count value to be measured and stored.

Since 011000 selects an operating curve that is above the middle curve 100000 (FIG. 2), the slow VCO is compensated for by choosing a curve with a faster frequency. The specified frequency of 2.44 GHz is achieved using a faster operating curve.

The total calibration time is a function of the pulse measurement period. For a 4 μs pulse measurement period for both fine and coarse calibration, the binary search of 6 bits requires 6×4 μs, while the fine calibration of 2B+1 curves requires (2B+1)×4 μs, for a total of (6+2B)×4 μs. For B=8, this is 88 μs. The center curve is already counted in coarse tune. The time to achieve PLL lock after calibration completes and switch 60 closes the PLL loop is about 25 μs. Closed-loop calibration would require multiples of 25 μs rather than multiples of 4 μs. Calibrating all 64 operating curves would require 64×4 μs or 256 μs. Thus fine calibration of only target window 34 reduces calibration time from 256 μs to 92 μs, a significant improvement.

ALTERNATE EMBODIMENTS

Several other embodiments are contemplated by the inventors. For example while a multi-mode divider 52 has been shown, a normal divider may be substituted, depending on the input and output frequencies needed. Sigma-delta modulator 48 with multi-mode divider 52 may be replaced with an integer-N divider, or may be deleted in some embodiments. Switch 60 could be implemented with MOS transistor switches or bipolar transistors.

The system may be useful for various applications, such as RF sampling systems, BLE, WIFI, RFID tags, etc.

While a variable capacitor has been shown in an embodiment of a multi-curve VCO, other variable delay mechanisms could be used, such as a variable resistor, a variable capacitor, a variable filter network, muxing of delay stages, etc. The input voltage of the VCO from the loop filter could be applied to the power-supply nodes of the inverters. The number and type of inverters could be varied, and a pair of cross-coupled inverting stages could be used rather than three or some other odd number of inverters. The LC oscillator, the input of VCO, may be connected to the varactor to control the oscillation frequency of curve 20.

While a period of time of 4 μs has been shown for counting pulses for fine calibration, other time periods could be substituted. Shorter time periods reduce calibration time but are less accurate. A long time period allows for more accurate measurement but lengthens calibration time. Rather than use 4 μs for both coarse and fine calibration, different time periods could be used. During binary search, shorter time periods could be used for the MSB's while longer, more accurate, time periods could be used for the LSB's. Ideal pulse counts could be adjusted for the differing time periods.

Rather than count VCO output pulses directly, the VCO output could be divided by K and the divided-by-K pulse count stored for each curve in target window 34. The ideal pulse count for the specified frequency channel could also be converted to correspond to the divided-by-K value. Pulse counts could be modified, such as being shifted, divided, multiplied, or their reciprocals taken, before or after storage.

Rather than have only one target window 34, there could be 2 or more target window 34 with their curve-select and pulse count values stored. For example, a wireless standard could specify several frequencies that could be used, and multiple target windows 34 could be calibrated to allow frequency hopping among these frequencies. Measurements from prior target window 34 could remain stored when a new target window 34 is calibrated, allowing the transceiver to jump back to the old frequency at a future time without requiring re-calibration.

The shorter calibration time allows for more frequent calibrations than if all curves were recalibrated. Calibration could be performed multiple times per day, and triggered periodically, after a temperature change, or by a power-up sequence.

While curve-select values having an inverse relationship with frequency have been shown, with 000000 corresponding to the highest-frequency operating curve and 111111 corresponding to the lowest-frequency operating curve, the values could be reversed so that 000000 corresponds to the lowest-frequency and 111111 corresponds to the highest frequency. The routines then could be adjusted for this changed definition of curve-select values.

The pulse count for fine calibration of the center curve CC, coarsely-selected curve 32, could be performed at the end of coarse calibration, as shown in FIGS. 7-9, or could be performed during fine calibration. Coarse calibration can be considered finished once CC is determined, and fine calibration begins with pulse counting for coarsely-selected curve 32. Then the last period in FIGS. 7-9 are really the beginning of fine calibration.

While FSM 58 has been shown, other kinds of sequencers or controller could be used, such as hardware, firmware, or hybrid controllers. The reference voltage VREF can be a fixed voltage such as VDD/2, or can be generated using a band-gap reference, voltage divider, or other reference generator.

Additional components may be added at various nodes, such as resistors, capacitors, inductors, transistors, buffers, etc., and parasitic components may also be present. Enabling and disabling the circuit could be accomplished with additional transistors or in other ways. Pass-gate transistors or transmission gates could be added for isolation. Inversions may be added, or extra buffering. Separate power supplies and grounds may be used for some components. Various filters could be added. Active low rather than active high signals may be substituted.

Additional components may be added at various nodes for various purposes, such as cut-off switches for power-down modes, voltage shifters, offset currents to set A.C. operating points, etc. Inverters may be replaced with differential amplifiers. Various reference voltages or virtual supplies may be used rather than a hard ground.

While binary search has been described, other encodings could be substituted, such as decimal or gray code. The digital values could be in these other number systems, such as octal numbers rather than binary numbers. Values could be complemented or inverted. The number of bits may be adjusted. Various kinds of counters such as ripple counters or synchronous counters could be substituted.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A multi-curve synthesizer comprising:
   a phase detector that compares a reference clock to a feedback clock;
   a charge pump activated by the phase detector;
   a loop filter that is charged and discharged by the charge pump;
   a voltage-controlled oscillator (VCO) having a VCO voltage input that determines a frequency of a VCO output, and a curve-select input that selects a selected operating curve from a plurality of operating curves causing the VCO to output different frequencies of the VCO output for a given voltage of the VCO voltage input;
   a switch that connects the loop filter to the VCO voltage input during a normal mode, and disconnect the loop filter and applies a reference voltage to the VCO voltage input during a calibration mode, wherein the multi-curve synthesizer operates in open-loop mode during the calibration mode;
   a feedback divider that divides the VCO output by a divisor to generate the feedback clock;
   a calibration unit having a pulse counter that receives the VCO output and generates a pulse count for a time period;
   a controller in the calibration unit that performs a binary search sequence of curve-select values applied to the curve-select input of the VCO to determine a center curve-select value that coarsely matches a specified frequency;
   the controller also for performing a fine calibration sequence that applies a range of curve-select values to the curve-select input of the VCO that are in a target window around the center curve-select value, and reads a pulse count for the time period from the pulse counter for each curve-select value for the target window; and
   the controller comparing an ideal pulse count for the specified frequency to the pulse counts read during the fine calibration sequence to find a closest-matching pulse count, the controller applying a curve-select value that generated the closest-matching pulse count to the curve-select input of the VCO for use during the normal mode,
   whereby coarse calibration determines the center curve-select value, and fine calibration selects the closest-matching pulse count of curves in the target window.

2. The multi-curve synthesizer of claim 1 wherein the target window has a subset of the plurality of operating curves, the subset being less than one-fourth of a number of operating curves in the plurality of operating curves,
   wherein the subset of the plurality of operating curves have their curve-select values measured for pulse counts during fine calibration;
   wherein most values of the curve-select value are not measured for pulse counts during calibration.

3. The multi-curve synthesizer of claim 1 wherein the target window comprises 2B+1 operating curves, wherein B is a whole number of at least 1 and no more than one-quarter a number of operating curves in the plurality of operating curves, wherein the controller counts pulses for 2B+1 time periods for 2B+1 curve-select values.

4. The multi-curve synthesizer of claim 3 wherein the plurality of operating curves comprises $2^N$ operating curves, wherein N is a whole number of at least 2, wherein the selected operating curve is selected from at least 4 operating curves.

5. The multi-curve synthesizer of claim 2 wherein at least half of the operating curves in the plurality of operating curves are not tested during fine calibration, wherein the target window comprise less than half of the operating curves in the plurality of operating curves.

6. The multi-curve synthesizer of claim 5 wherein the curve-select value is a binary word having at least 2 bits;
   wherein the plurality of operating curves comprises at least 64 operating curves represented by at least 64 values of the curve-select value.

7. The multi-curve synthesizer of claim 6 wherein the binary search sequence comprises, for each binary bit in the curve-select value, starting with a Most-Significant-Bit (MSB) as a current bit:
   (a) forcing the current bit high and forcing low all bits having less significance than the current bit in a current curve-select value;
   applying the current curve-select value to the curve-select input of the VCO;
   using the pulse counter to count a current number of pulses of the VCO output over a time period;
   comparing the current number of pulses to an ideal pulse count for the specified frequency and setting the current bit high or low as a result of a comparison, the current bit not changing when testing remaining bits during the binary search sequence;
   repeating from (a) using a next lesser-significant bit in the curve-select value as the current bit;
   when a Least-Significant-Bit (LSB) in the curve-select value has been set high or low as the result of the comparison, outputting the curve-select value as the center curve-select value.

8. The multi-curve synthesizer of claim 6 wherein the pulse counter comprises:
   a divided pulse counter;
   a pre-divider that generates a pulse to the divided pulse counter after every K pulses of the VCO output, wherein K is a real number of at least 1;
   whereby the VCO output is divided by K before counting.

9. The multi-curve synthesizer of claim 6 wherein the feedback divider is a multi-mode divider allowing for fractional divisors.

10. The multi-curve synthesizer of claim 9 further comprising:
    a sigma-delta modulator, coupled to the feedback divider, for dithering two or more integer divisors to apply to the feedback divider.

11. A calibrating clock generator comprising:
    a multi-curve voltage-controlled oscillator (VCO) that generates a VCO output having a frequency determined by a VCO analog input, and an operating curve determined by a curve-select digital input;
    wherein the multi-curve VCO operates using one of $2^N$ operating curves in response to the curve-select digital input having N binary bits, each operating curve specifying a different frequency of the VCO output generated by the multi-curve VCO for a center voltage applied to the VCO analog input;
    wherein N is a whole number of at least 2;
    a feedback divider that generates a feedback clock by dividing the VCO output by a divisor;
    a phase comparator that compares the feedback clock to a reference clock to generate a phase-compare result;
    a loop filter generating a loop voltage;

a charge pump that charges and discharges the loop filter in response to the phase-compare result;
a switch that connects the loop voltage to the VCO analog input during a normal mode of operation, and connects a reference voltage to the VCO analog input during a calibration mode;
a clock counter that receives the VCO output and generates a measured count value;
a state machine that reads the measured count value from the clock counter and generates a curve-select value to the curve-select digital input of the multi-curve VCO;
a coarse calibration routine performed using the state machine, that sequences the curve-select value in a binary search sequence over N time periods to determine a center curve-select value;
a fine calibration routine performed by the state machine, that generates a target-window plurality of the curve-select values that are adjacent to the center curve-select value and within a target window around the center curve-select value;
the fine calibration routine testing curve-select values from the target-window plurality of curve-select values to find a closest-matching measured count value that most closely matches a specified count value; and
during the normal mode of operation, the state machine applying to the curve-select digital input of the multi-curve VCO the curve-select value that generates the closest-matching measured count value,
whereby coarse calibration uses binary search to find the center curve-select value, and fine calibration finds a closest-matching measured count value for the target-window plurality of the curve-select values that are within a target window around the center curve-select value.

12. The calibrating clock generator of claim 11 wherein the fine calibration routine operates on a subset of the $2^N$ operating curves, the subset having only the target-window plurality of the curve-select values that are adjacent to the center curve-select value and within a target window around the center curve-select value;
wherein the subset is less than half of the $2^N$ operating curves.

13. The calibrating clock generator of claim 12 wherein the specified count value is for a specified frequency that is a frequency of the VCO output that is being calibrated for.

14. The calibrating clock generator of claim 13 wherein the state machine when executing the fine calibration routine, applies a curve-select value from the target-window plurality of curve-select values to the curve-select digital input and reads the measured count value from the clock counter after waiting for a time period, and compares the measured count value to the specified count value, and repeats for other curve-select value from the target-window plurality of curve-select values until the closest-matching measured count value is found.

15. The calibrating clock generator of claim 13 wherein the target window has curve-select values that are no more than B away from the center curve-select value, where B is a whole number and is less than one-quarter of $2^N$;
wherein many curve-select values are not tested during fine calibration.

16. The calibrating clock generator of claim 13 wherein during the binary search sequence, the state machine reads the measured count value from the clock counter after each of the N time periods and compares the measured count value to the specified count value for a specified frequency to set a current binary bit high or low in the center curve-select value.

17. The calibrating clock generator of claim 13 wherein the clock counter further comprises:
a fast divider that receives the VCO output and generates a divided signal having a reduced frequency than the VCO output; and
a divided clock counter that counts the divided signal from the fast divider to generate a measured count value.

18. A dual-level calibrating Phase-Locked Loop (PLL) generator comprising:
phase compare means for comparing a feedback clock to a reference clock to generate a phase-compare result;
loop filter means for generating a loop voltage;
charge pump means for charging and discharging the loop filter means in response to the phase-compare result;
switch means for connecting the loop voltage to a VCO analog input during a normal mode of operation, and for connecting a reference voltage to a VCO analog input during a calibration mode;
feedback divider means for generating a feedback clock by dividing a VCO output by a divisor;
voltage-controlled oscillator (VCO) means for generating the VCO output having a frequency determined by the VCO analog input, and having an operating curve determined by a curve-select digital input;
wherein the VCO means is further for operating using one of $2^N$ operating curves in response to the curve-select digital input having N binary bits, each operating curve specifying a different frequency of the VCO output generated by the VCO means for a center voltage applied to the VCO analog input;
wherein N is a whole number of at least 2;
coarse calibration means for sequencing a curve-select value applied to the curve-select digital input in a binary search sequence over N time periods to determine a center curve-select value;
fine calibration means for generating a final curve-select value that generates a closest-matching measured count value that most closely matches a specified count value for a specified frequency of the VCO output;
wherein the fine calibration means further comprises test means for testing a target-window plurality of the curve-select values that are adjacent to the center curve-select value and within a target window around the center curve-select value;
wherein the test means is for testing curve-select values from the target-window plurality of curve-select values to find the closest-matching measured count value that most closely matches a specified count value; and
normal mode means, activated during a normal mode of operation after calibration ends, for applying to the curve-select digital input of the VCO means the curve-select value that generates the closest-matching measured count value.

19. The dual-level calibrating Phase-Locked Loop (PLL) generator of claim 18 further comprising:
clock counting means for counting pulses of the VCO output over a specified period of time to generate a measured count value;
store means for storing the measured count value with a curve-select value applied to the curve-select digital input of the VCO means during the specified period of time in which the measured count value was generated;

wherein measured count values are stored for all curve-select values in the target-window plurality of curve-select;

wherein the test means reads the measured count values and compares the measured count value to the specified count value to find the closest-matching measured count value.

20. The dual-level calibrating Phase-Locked Loop (PLL) generator of claim 19 wherein the clock counting means further comprises:

fast divider means, receiving the VCO output, for generating a divided signal having a reduced frequency than the VCO output;

clock counter means for counting the divided signal from the fast divider means to generate the measured count value.

* * * * *